Figure 1:
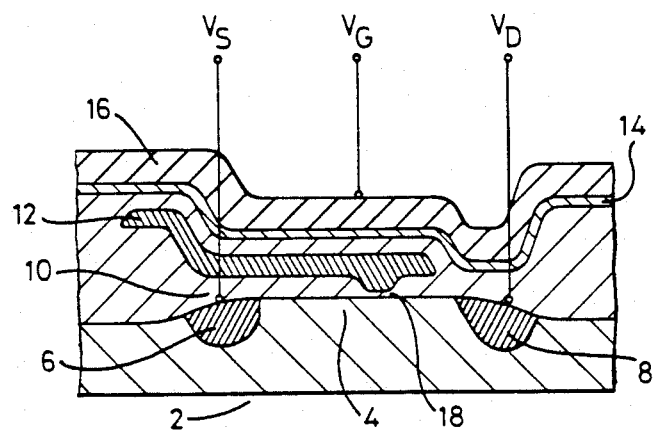

United States Patent [19]

West et al.

[11] Patent Number: 4,733,482

[45] Date of Patent: Mar. 29, 1988

[54] EEPROM WITH METAL DOPED INSULATOR

[75] Inventors: James L. West, Kircaldy; Alan E. Owen; Komanduri V. Krishna, both of Edinburgh; Jaoquim J. Delima, Thornton Heath, all of Great Britain

[73] Assignee: Hughes Microelectronics Limited, Glenrothes, Scotland

[21] Appl. No.: 35,524

[22] Filed: Apr. 7, 1987

[51] Int. Cl.$^4$ ............. H01L 29/78; H01L 29/67; G11C 11/40
[52] U.S. Cl. ............................. 357/23.5; 357/63; 357/54
[58] Field of Search ............... 357/23.5, 63, 54

[56] References Cited

U.S. PATENT DOCUMENTS 4,494,996 1/1985 Ohno et al. ............................ 357/63

FOREIGN PATENT DOCUMENTS 0128061 12/1984 European Pat. Off. ........... 357/23.2

Primary Examiner—Martin H. Edlow
Assistant Examiner—John Lamont
Attorney, Agent, or Firm—Kenneth W. Float; A. W. Karambelas

[57] ABSTRACT

Insulating layers responsible for the trapping of electric charge in non-volatile semiconductor memories, such as FAMOS or MNOS, are fabricated as thicker layers when doped with metals having partially filled d or f electron shells. Typically the insulating layer is silicon oxide doped with up to 10 atomic % of a first transition series metal.

9 Claims, 2 Drawing Figures

EEPROM WITH METAL DOPED INSULATOR

This invention relates to non-volatile semiconductor memories and particularly to those which store non-volatile information as electrical charge at the surface of or within specific layers of the device and which are partially or wholly isolated by one or more dielectric layers such as of silicon oxide or silicon nitride.

A number of different devices exist of the type just described. A representative number of the most common will be briefly exemplified.

One example is the FAMOS device. Avalanche breakdown of a MOS channel is created and the electrons are attracted to a floating gate surrounded by a dielectric layer. The electrons flow easily through the latter layer as a consequence of a capacitive positive charge impressed on the floating gate from an overlying control gate. When the device is switched off, the electrons remain trapped on the floating gate.

Further examples function by providing, in at least some parts of the device, only a very thin layer of dielectric. It is postulated that the mechanism for charge transfer to a floating gate is electron tunnelling (known as Fowler-Nordheim tunnelling) through the thin dielectric layer. One such device is described, for example, in the U.K. Patent Specification No. 2000407A under the acronym FATMOS and a typical commercial example is Hughes Aircraft Company device HNVM 3008.

Another memory device which relies on tunnelling is the MNOS, where a very thin layer of silicon oxide dielectric is overlaid by a thicker layer of silicon nitride. When an overlying metal gate of the device is negatively-biassed, electrons are forced out of the nitride, tunnel through the thin oxide layer to be dissipated in the substrate. This leaves a positive charge trapped at the oxide-nitride interface which remains even after the gate bias is removed.

The present invention relates to an improvement applicable to all such types of devices, but particularly (although not exclusively) to those which employ thin silicon oxide dielectric layers as tunnels for electrons.

Two disadvantages exist with dielectric tunnel memories. Firstly, the tunnel thicknesses are very low (typically of the order of 50 Angstroms). This represents a layer only a few monolayers thick. Not only are such delicate layers difficult to fabricate reproducibly, but they can be prone to breakdown after extended device cycling. Secondly, in order to induce tunnelling, relatively high voltages (typically 15 volts) are required. Since generally semiconductor devices operate at much lower voltages—of the order of 5 volts—this necessitates the need to provide voltage amplification from extra voltage pump circuitry.

We have discovered that certain transition metal-doped amorphous silicon oxide materials, whilst retaining their essentially insulating properties, have a higher conductivity than the pure amorphous silicon oxide. If they are employed as the tunnel material in such memories, then to provide insulating properties comparable to pure silicon oxide the tunnel must be made much thicker. We have discovered however that even with such thicker tunnels, charge transfer can be induced at field strengths lower than required for the pure material. These factors mean that more robust tunnels, easier to fabricate and less liable to breakdown (especially on repeated cyclic use) can be provided. Moreover, the need for high charge transfer-inducing voltages is reduced if not eliminated. The devices are inherently more durable.

Certain of these metal-doped (vanadium and cobalt) amorphous silicon oxide materials have been described in the literature by Krishna, Delima, Eze, and Owen: "Physica", 192B (1985) pp. 245-248. This latter paper describes a unique property of the materials—they possess predictable, stable dual (high and low) conductance states. It is possible to switch between the states by the application of a high electric field. This present invention does not take advantage of the switching between the two conductance states and only employs the material in one, preferably its low conductance state. When the low conductance state is employed, we have discovered that the material may be used as a tunnel, and charge transfer may be induced, at a electric field strength which is insufficient to cause the material to switch to its high conductance state.

Although the work conducted by Krishna et al. related to amorphous silicon oxide films, we have no reason to believe that the properties imparted thereto by metal doping are not also imparted to other amorphous inorganic oxide or nitride insulators used in the semiconductor industry, such as silicon nitride, silicon oxynitride, or aluminium oxide.

According to the invention there is provided a semiconductor memory device wherein non-volatile information is retained by storage of electrical charge trapped in or at a layer of the device surrounded by a dielectric layer, at least a portion of said dielectric layer comprising an amorphous inorganic oxide and/or nitride insulating material doped with a metal whose atomic number is 21 to 28, 39 to 46, or 57 to 78.

Preferably the inorganic insulating material is an aluminium or silicon oxide and/or nitride—e.g. aluminium oxide, silicon oxide, silicon oxynitride, or silicon nitride.

The mechanism whereby the metal doping affects the conductance of the amorphous inorganic insulating material is not fully understood, but appears to be associated with the unfilled electron shells of the metals in question. We believe that the phenomenon is experienced by any of the transition metals or rare earth metals (lanthanides), although for the sake of convenience, economy and safety only the most common and easy to handle metals are likely to be used in the present invention. Therefore, although we do not exclude the use of any metal which, as an element, has a partially-filled d or f electron shell, we believe it is likely that only those from the first transition metal series will be commercially attractive.

In general, an increase in the concentration of metal dopant in the amorphous insulating material increases conductivity and enables thicker dielectric layers to be used in the tunnel. However, as concentration increases so the amorphous insulating material loses its dielectric properties and tends to behave as a metal conductor. We have found that metal dopant concentrations of about up to 10 atomic % may be employed satisfactorily in the invention.

The doped insulating layers as employed in the devices of the invention may, for example, be obtained by first laying down a layer of pure amorphous insulating material and then adding the metal dopant by e.g. ion implantation. Alternatively the layer may be formed in one step by, for example, co-sputtering of the metal and insulating material by attaching strips of the metal to the oxide target, or by chemical vapour deposition. After preparation the layer may be annealed at high temperature (about 1000° C.) in an inert atmosphere. As prepared, the layer may be initially in an unstable electrical state, but may be stabilised to the low conductance state by application of a high electric field across the layer.

In current tunnel semiconductor memories the tunnel (when fabricated of silicon oxide) is typically 40 to 80 Angstroms thick. With a corresponding metal-doped amorphous silicon oxide the tunnel thickness may be increased up to, for example, from 200 to 1000 Angstroms.

Figure 2:
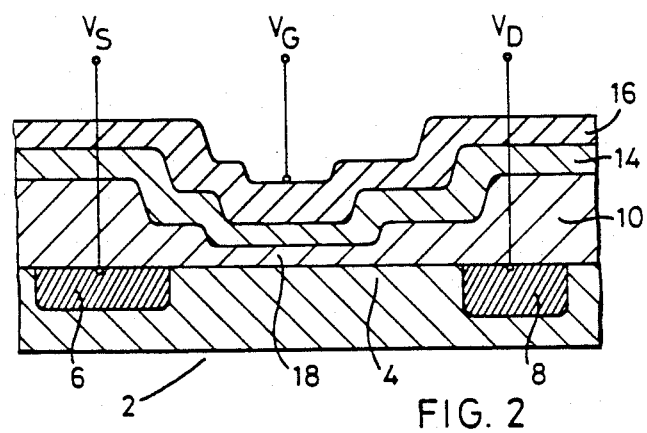

Preferred features of the invention will now be described by way of example with reference to the accompanying drawing wherein:

FIGS. 1 and 2 are schematic cross-sections through semiconductor devices according to the invention.

Referring to FIG. 1, there is illustrated a FATMOS memory of the type employed in the Hughes Aircraft Company EEPROM type HNVM 3008. It comprises an MOS structure 2 consisting of p-doped layer 4 serving as the channel and n+ source and drain areas 6 and 8. Above the MOS structure is a layer 10 of V- or Co-doped amorphous silicon oxide (about 5 to 10 atomic % doping) which enclose a polysilicon floating gate 12. Above layer 10 is an optional layer 14 of silicon nitride and above the latter is an aluminium layer 16 which acts as a control gate.

A portion of the floating gate 12 dips down closer to the MOS structure to provide a tunnel area 18 in the metal-doped silicon oxide. Whereas in the current HNVM 3008 the tunnel thickness is below 100 Angstroms and a charge transfer inducing voltage of about 15 volts on the control gate is required, in the presently described embodiment the metal-doped tunnel is increased to a thickness of 400 Angstroms. At this thickness it gives a charge transfer current comparable to the known device but at a lower voltage (about 8 volts).

In use the device operates in exactly the same manner as the FATMOS described, e.g. in U.K. Patent Specification No. 2000407A but with a lower control gate voltage for non-volatile read or write. It is not essential that the tunnel be above the channel 4 as illustrated and it may be disposed elsewhere above the MOS structure.

FIG. 2 illustrates an MNOS memory according to the invention. Using like numerals as FIG. 1, it comprises MOS 2 with channel 4, source 6 and drain 8 areas. A layer of V- or Co-doped amorphous silicon oxide 10 overlies MOS 2 and is itself covered with a layer 14 of silicon nitride. The latter is about 500 Angstroms thick. In the tunnel area 18 of the metal-doped amorphous silicon oxide layer 10 the thickness is about 400 Angstroms as compared to the 25 Angstroms typically employed in traditional MNOS devices. Overlying the silicon nitride is an aluminium control gate 16. The device operates in exactly the same manner as the known MNOS device.

We claim:

1. A semiconductor memory device wherein non-volatile information is retained by storage of electrical charge trapped in or at a layer of the device surrounded by a dielectric layer, at least a portion of said dielectric layer comprising an amorphous inorganic oxide and/or nitride insulating material doped with a metal whose atomic number is 21 to 28, 39 to 45, or 57 to 78.

2. A device according to claim 1 wherein the metal is a transition metal.

3. A device according to claim 2 wherein the metal is from the first transition metal series.

4. A device according to claim 3 wherein the metal is vanadium or cobalt.

5. A device according to claim 1 wherein the amorphous inorganic insulating material is silicon oxide, aluminum oxide, silicon oxynitride or silicon nitride.

6. A device according to claim 1 wherein the metal dopant concentration is up to 10 atomic percent.

7. A device according to claim 1 which has a floating gate disposed above a thin layer of the metal-doped amorphous inorganic insulating material.

8. A device according to claim 7 wherein the thickness of the thinnest part of said metal-doped amorphous inorganic insulating material layer is 200 to 1000 Angstroms.

9. A device according to claim 1 wherein the metal-doped amorphous inorganic insulating material layer has two predictable, stable conductance states, and said device operates with said layer in the lower of said two conductance states.

* * * * *